United States Patent [19]

Venkataramanan et al.

[11] Patent Number: 4,647,512
[45] Date of Patent: Mar. 3, 1987

[54] DIAMOND-LIKE CARBON FILMS AND PROCESS FOR PRODUCTION THEREOF

[75] Inventors: N. Venkataramanan, Brookfield Center; Charles B. Zarowin, Rowayton, both of Conn.

[73] Assignee: The Perkin-Elmer Corporation, Norwalk, Conn.

[21] Appl. No.: 841,917

[22] Filed: Mar. 20, 1986

[51] Int. Cl.[4] .............................................. B32B 9/00
[52] U.S. Cl. ...................................... 428/688; 427/39
[58] Field of Search ........................... 428/688; 427/39

*Primary Examiner*—Bernard D. Pianalto
*Attorney, Agent, or Firm*—Thomas P. Murphy; Edwin T. Grimes; Francis L. Masselle

[57] ABSTRACT

Improved diamond-like carbon films of improved properties are deposited on various substrates utilizing a plasma assisted chemical vapor transport process (PACVT) process in which hydrogen is employed as the reactive process feedgas and in which the deposition process is conducted in a controllably energetic ion bombardment of the surface on which the films are grown by introducing the hydrogen feedgas into the reactor volume through a porous graphite electrode into a defined plasma geometry.

10 Claims, 4 Drawing Figures

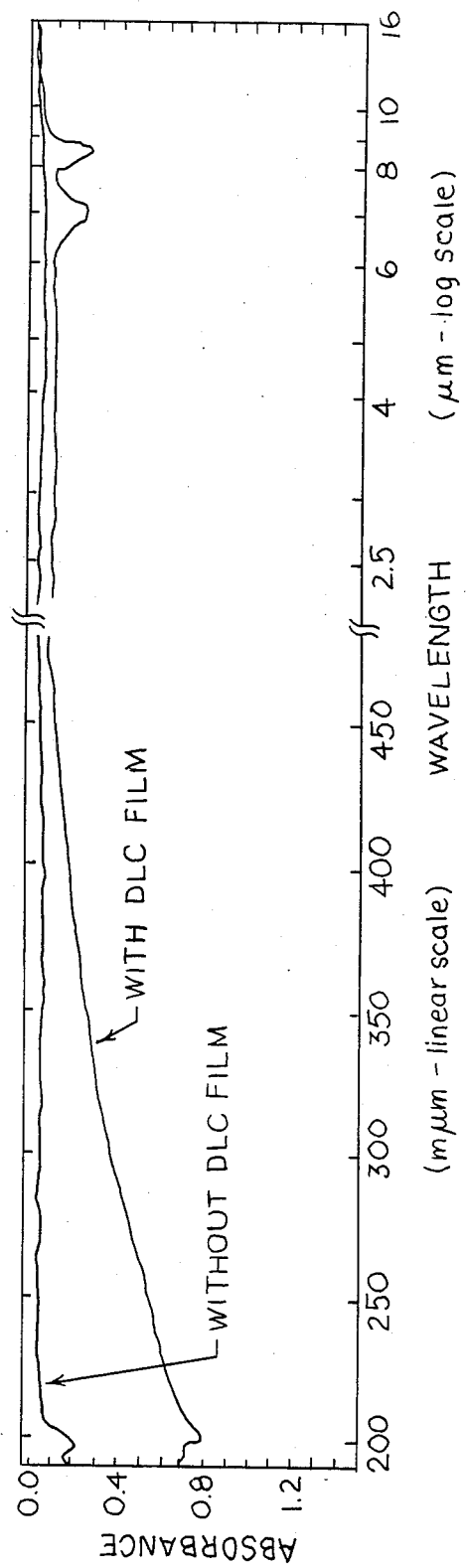
Fig. 4 OPTICAL ABSORPTION SPECTRUM OF KBr SUBSTRATE WITH AND WITHOUT DLC FILMS BETWEEN 200 mμm AND 16 μm

DIAMOND-LIKE CARBON FILMS AND PROCESS FOR PRODUCTION THEREOF

FIELD OF THE INVENTION

This invention relates to improved diamond-like carbon films and to a plasma assisted chemical vapor transport (PACVT) process for producing such improved films.

BACKGROUND TO THE INVENTION

In the optical and microelectronics fields many currently available coatings suffer from numerous drawbacks and inconsistent properties. Among the drawbacks there may be mentioned for example, low dielectric strength, poor physical durability, poor transparency or a very narrow band gap of transparency, moisture absorption, inadequate chemical resistance and the like.

Recently, considerable interest has developed in diamond-like carbon films for such optical and microelectronics applications because of their more desirable properties, in some respects, which is attributable to the heterophase structure of the films.

Among the highly desirable and useful properties that diamond-like carbon films are expected to possess there may be mentioned, for example, high transparency in the UV, visible and infra-red wavelengths, an index of refraction and hardness approaching that of diamond, strong adhesion to substrates, high dielectric strength and chemical inertness. Until now, to the best of our knowledge, diamond-like carbon film have only exhibited some of these properties simultaneously.

It is recognized that diamond-like carbon films are grown when carbon is deposited in a low-temperature plasma, at which time the high pressures and temperatures, necessary for forming the diamond-like structure, are achieved by collisions with a substrate surface by particles having high kinetic energy. Previously diamond-like carbon films have been produced by rf sputtering, "ion plating" and "plasma decomposition" processes. However, most of the film growth conditions and the resulting films are not well defined due to inadequate understanding of the factors controlling the ion energy. As a result diamond-like carbon film of defined properties and characteristics have not been able to be produced on a reproducible basis. Nor has it been possible to produce diamond-like carbon films exhibiting most of all of the aforementioned desirable properties and characteristics.

Previously, plasma decomposition reactions employing a hydrocarbon product gas, such as methane, ethane, propane and isobutane, as the carbon source have been utilized. However, in such plasma decomposition processes, the saturation partial pressure of the product (i.e. its equilibrium concentration near the deposited film) must be markedly exceeded to drive the deposition reaction. Yet, the risks are undesirable homogeneous decomposition of the product gas to carbon and/or other involatile species in the reactor volume, potentially causing carbon to rain on the surface of the substrate rather than producing the desired heterogeneous growth process on the substrate surface. This is more likely to result in softer amorphous films with more inclusions and poor adhesion.

It is therefore highly desirable that a process be made available whereby diamond-like carbon films are produced without said drawbacks. It is likewise desirable that an improved process for depositing diamond-like carbon films be provided which produces diamond-like carbon films of improved and more uniform properties and characteristics. It is also most desirable that a process be provided where unwanted homogeneous production of carbon in the reactor is avoided or substantially eliminated.

BRIEF DESCRIPTION OF DRAWINGS

FIG. 4 is a comparative plot of the optional absorbance spectrum of a KBr substrate with and without a diamond-like carbon film produced according to the present invention.

SUMMARY OF THE INVENTION

It has now been discovered that diamond-like carbon films may be provided by depositing such films on substrates supported by an electrode by utilizing a plasma assisted chemical vapor transport (PACVT) process in which hydrogen is employed as the reaction process feedgas and is introduced into a reactor volume of fixed plasma geometry through a suitable porous graphite electrode in a manner to generate ion energies of 10–100 eV believed required to achieve the graphitic to diamond-like phase change.

In this PACVT process hydrogen reacts with solid carbon at the graphite electrode surface to produce a volatile hydrocarbon reaction product which is then transported from the graphite source at which it has been generated to the substrate on which it is deposited as elemental carbon to produce the diamond-like carbon film in the reverse heterogeneous chemical reaction. This has the advantage that only the partial pressure of the volatile product compound required to drive the heterogeneous chemical deposition is generated in contrast with the saturation partial pressure of this product for prior plasma decomposition processes. This is especially advantageous to avoid undesirable homogeneous decomposition to carbon and other involatile species which may rain on the substrate surface to yield undesirably amorphous films.

In the plasma assisted PACVT process the surface ion bombardment energy provides a catalytic enhancement of the heterogeneous chemical transport reaction producing the deposition. Also, this PACVT process permits the generation of such a film at a point in its phase diagram (p,T) for which the metastable diamond-like phase occurs without passing through an unstable intermediate phase(s) that may otherwise preclude the generation of the diamond-like film.

DETAILED DESCRIPTION OF THE INVENTION

Background theory on the operation of PACVT processes is found in C. B. Zarowin, J. Appl. Phys. 57 (3), 929 (1985) and C. B. Zarowin, J. Vac. Sci. Technol. A2 (4), 1537 (1984).

Figure 1:
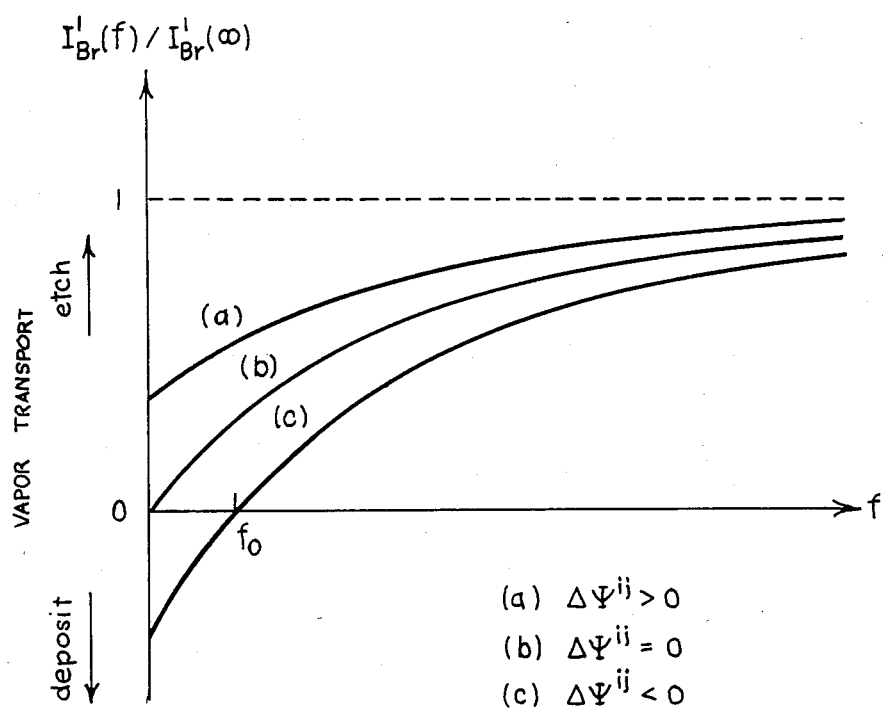
FIG. 1 is a plot of transport rates vs feedgas flow for PAVCT systems for surfaces having different chemical potential differences.

FIG. 1 is a plot of transport (deposit/etch) rate vs flow rate for surfaces having positive (line a), zero (line b) and negative (line c) chemical potential difference. The PACVT process of this invention is a process with a negative chemical potential difference between surfaces. Thus, the process is expected to exhibit flow behavior according to line c of FIG. 1. Such flow behavior is characterized by a decreasing deposition rate below or increasing etch rate above the flow fo. This is the flow at which transport driven by flow and surface chemical potential differences cancel.

To obtain higher homogeneous deposition rates with the PACVT process of this invention, there is employed hydrogen reactant pressures near 2 Torr, which is orders of magnitude greater than employed in earlier plasma decomposition processes. At these higher pressures the ion energies of 10–100 eV apparently needed for the graphite to diamond-like phase change were obtained by producing a power density of more than 5 watts/cm$^3$ in the plasma utilizing a 13.56 MHz rf generator. A small enough hydrogen gas flow into the reactor is used to favor deposition over flow driven etching according to line c of FIG. 1.

Achieving the aforesaid high ion energies at these pressures requires a reactor design with the following characteristics: (a) a controlled, fixed plasma geometry such that the rf power density and thus the ion energy varies nearly linearly with power and does not saturate with power; (b) a means of introducing the hydrogen feedgas into the reactor and means for removing it, and any transport reaction products, without obviating characteristic (a); and (c) that the means (b) be arranged so as to assure essentially uniform feedgas pressure in the reactor.

Figure 2:
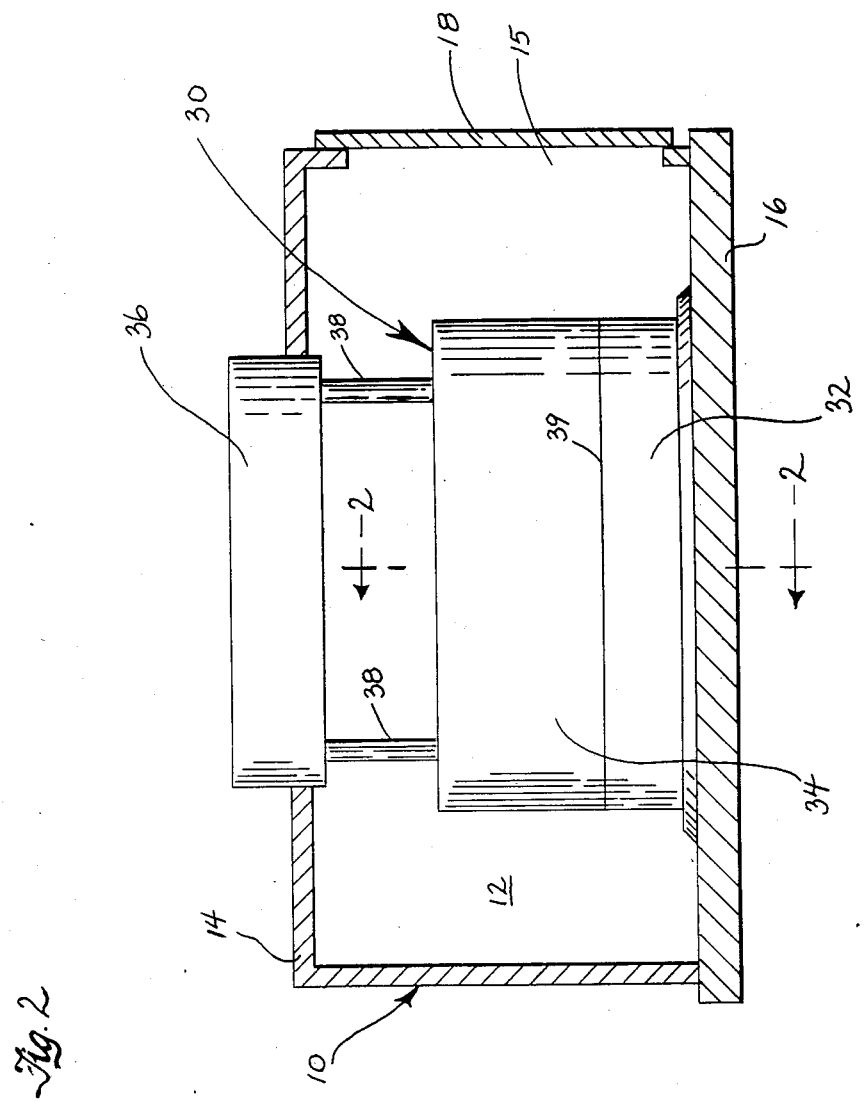
FIG. 2 is a partial elevational sectional diagramatic view of apparatus for conducting the process of this invention.
Figure 3:
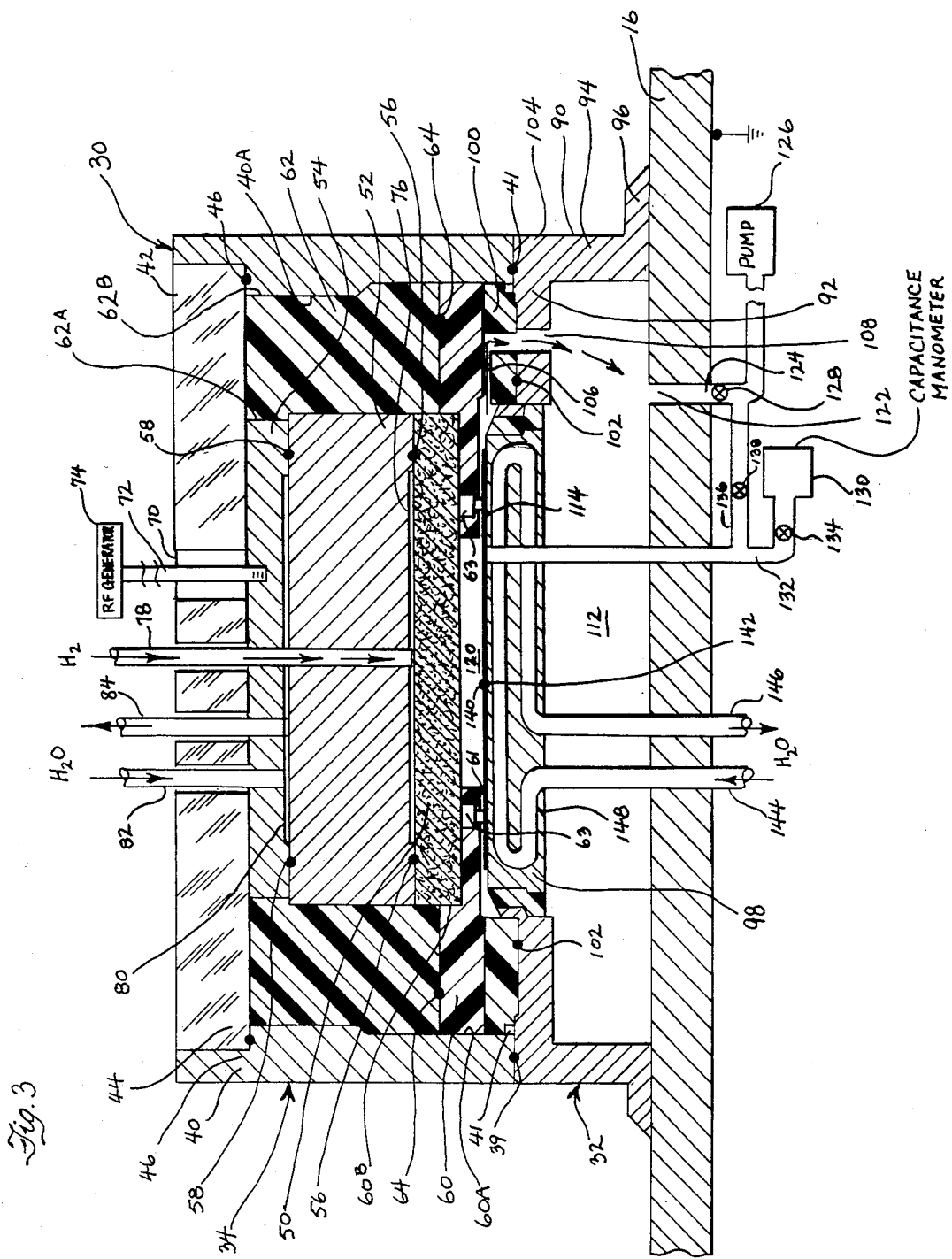
FIG. 3 is an elevational view taken along line 2—2 in FIG. 2 and shown enlarged.

We have found that these required characteristics are met by the plasma reactor shown in the apparatus illustrated in FIGS. 2 and 3.

In FIGS. 2 and 3 there is shown an exemplary apparatus suitable for use in conducting the PACVT process of this invention. The apparatus 10 includes an enclosed load lock chamber 12 formed by outer housing 14 and base plate 16. Outer housing 14 is provided with an access port 15 for providing ingress and egress to chamber 12. The access port may be covered with any suitable removable cover 18 such as a pivoting or hinged door. Chamber 12 is enclosed and access port 16 is covered in a closed position during the process so as to provide a suitable constant pressure chamber. Inside apparatus 10 and within chamber 12 there is located the plasma reactor 30 suitable for conducting the PACVT deposition process of this invention. Plasma reactor 30 comprises a lower reactor portion 32 and an upper reactor portion 34, each described in greater detail in FIG. 3. In operation upper reactor portion 34 separates from lower reactor portion 32 at parting line 39. Separation or lifting of the upper reactor portion 34 may be accomplished, for example, by hydraulic lift means 36 operating through lift arms 38.

With reference to FIG. 3 plasma reactor 30 is shown in greater and enlarged detail. The upper portion 34 of the plasma reactor 30 comprises an outer, preferably cylindrical axial reactor side wall 40, preferably of anodized aluminum, and a top cover 42, preferably Plexiglass material, mounted on axial shoulder 44 formed in side wall 40. Sealing of top cover 42 on upper axial shoulder 44 may be by means of axial O-ring 46 on shoulder 44. Within upper reaction portion 34 there is located a porous graphite upper electrode 50 mounted to axial spacer 52, preferably of aluminum, which is in turn mounted to axial support member 54 in sealing arrangement with each other by axial O-rings 56 and 58, respectively.

Upper electrode 50, spacer 52 and support member 54 are retained in place by circumferential gas flow control ring 100, axial substrate holding ring 60, and upper axial plasma confinement ring 62 located axially between upper electrode 50 and side wall 40 and supported by lower axial shoulder member 41 on side wall 40. Inner axial wall 62A of plasma confinement ring 62 abuts against the outer circumference of support member 54, spacer 52 and upper porous electrode 50 while outer axial wall 62B of said ring 62 abuts the inner surface 40A of wall 40. Similarly, inner axial wall 60A of substrate holding ring 60 abuts the outer circumference of electrode 50 and the outer axial wall 60B of said ring 60 abuts the inner surface 40A of wall 40. Plasma confinement ring 62, substrate holding ring 60 and gas flow control ring 100 are formed of chemically inert, non-conducting material, preferably Teflon elastomer. These rings permit maintenance of a constant plasma volume which is necessary for achieving the required ion energies at the higher operating pressures employed in this invention. Plasma confinement ring 62 and substrate holding ring 60 are in sealing arrangement by means of axial O-ring 64.

Through access port 70 in top cover 42 enters a rf lead 72 from rf generator 74 (located remotely) to provide rf power to the upper electrode 50. An axial chamber 76 between axial spacer 52 and porous graphite electrode 50 is provided to receive hydrogen feedgas provide through feedgas input conduit 78.

Located circumferentially on substrate holding ring 60 and projecting downwardly from the lower surface 61 thereof is a plurality of spring loaded leveling buttons 63, preferably of Teflon elastomer, for maintaining a constant distance between the two electrode in the plasma reactor; preferably a distance of about 0.5 cm.

Control of the temperature of porous graphite electrode 50 is maintained by water circulating to axial temperature control chamber 80 located between spacer 52 and support member 54. Water is provided to and returned from temperature control chamber 80 through water inlet port 82 and water outlet port 84.

Lower portion 32 of plasma reactor 30 is formed on its lower side by base 16 (connected to ground) of the outer housing 14 of apparatus 10. Lower electrode cylindrical support member 90 having upper support plate 92, a circumferentially downwardly extending skirt member 94 and axially outwardly extending foot member 96 at the lower end of the skirt member rests on base plate 16 and support lower electrode 98. Lower electrode 98, preferably of stainless steel, is of equal area to upper electrode 50. Upper support plate 92 of support member 90 sealing engages gas flow control ring 100 and side wall 40 of the upper reaction portion 34 by inner and outer axial O-ring 102 and 104 respectively.

As stated previously, upper reactor portion 34 and lower reactor portion 32 separate at parting line 39. Sealing of wall 40 of portion 34 to support plate 92 of portion 32 is in way of axial O-ring 41 located on support plate 92.

Defined by lower electrode 98, upper support plate 92, flow control ring 100, skirt member 94 and base plate 16 is exhaust chamber 112 for a purpose to be discussed hereinafter.

A deposition substrate 114 is supported on lower electrode 98 and provides the surface on which the film is deposited according to the process of this invention.

Gas flow control ring 100 is provided with a plurality of narrow annular apertures 106 leading to a plurality of circumferential placed exits ports 108 through ring 100 and support plate 92 whereby reactants and some of the reaction products are permitted to exit from plasma chamber 120 of fixed geometry located between upper graphite electrode 50 and lower electrode 98 and enter exhaust chamber 112. The size of the narrow annular apertures will generally be about 0.2 mm so as to permit removal of the hydrogen gas and some of the reaction products from the plasma chamber in a manner such that the rf power density varies nearly linearly with power.

Base plate 16 is provided with an exhaust port 122 connected by conduit 124 to a pump 126 for removal of the reactants and some of the reaction products. Conduit 124 is provided with a suitable shutoff valve 128.

A capacitance manometer 130 for monitoring the pressure in plasma reaction chamber 120 during deposition is provided and connected to the plasma reaction chamber by conduit 132 having shutoff valve 134 therein. Conduits 132 and 124 are connected by linking conduit 136 having shutoff valve 138 therein providing a by-pass arrangement for clean up of the system after deposition is completed.

The temperature in lower electrode 98 is monitored by thermocouple 140 connected by thermocouple lead wire 142 connected to a temperature display device (not shown). Regulation of the temperature of the lower electrode is provided by lower electrode water inlet and outlet ports 144 and 146, respectively, which permits water to enter and exit lower electrode water circulating chamber 148.

In operation, when upper reactor portion 34 is hydraulically brought into sealing relationship with lower reaction portion 32, spring loaded buttons 63 mounted in substrate holding ring 60 adjust, based on any unevenness of deposition substrate 114, so as to enable upper porous electrode 50 and substrate 114 to be spaced uniformly apart from each other.

The construction of the device according to this invention restricts the plasma to a fixed volume, in the plasma reaction chamber 120, as rf power is increased and thereby permits achievement of the power necessary for the PACVT deposition process of this invention.

A porous graphite utilizable as the porous graphite electrode 50 in the process of this invention, may be a porous graphite with a gas flow impedance on the order of $10^{-2}$ sec/cc.

The pressure difference between the porous graphite electrode and the lower electrode must be kept small, that is, the pressure inside the plasma reaction chamber 120 should be uniform, and the flow impedances be equal and small at the inlet and outlet to the plasma reaction chamber. Gas flow control ring 100 provides these features by permitting exhaust of reactant and some reaction product out through annular slots 106 in controlled fashion.

Table I following presents a summary of the conditions at which diamond-like carbon films of this invention are deposited on a suitable substrate. The deposited film thicknesses were determined using a profilometer across a step between an (masked) uncoated area and a (unmasked) coated area of the substrate. Comparison of runs A, B, F and G in said Table demonstrate that the process qualitatively exhibits the flow behavior expected of a chemical vapor transport process with a negative chemical potential difference between surfaces. Also from runs A and B it can be seen that the deposition rate increases as the upper graphite electrode becomes hotter and decreases as it becomes cooler suggesting that the transport reaction is endo-energetic.

The films were deposited utilizing a reactant gas, (hydrogen) pressure of 2 Torr. At this higher pressure the ion energies of 10–100 eV needed for the graphitis to diamond-like phase change were obtained by producing a power density of 5 to 10 watts/cm$^2$ in the plasma with a 13.56 MHz rf generator. In these runs the two electrodes were separated by a space of about 0.5 cm.

TABLE I

DEPOSITION PARAMETERS AND RESULTS
RF POWER = 200 W   PRESSURE = 2 TORR OF H$_2$

| RUN | FLOW (sccm) | TEMP. (°C.) GRAPHITE | TEMP. (°C.) SUBSTR. | TIME (min.) | THICKNESS |
|-----|-------------|----------------------|---------------------|-------------|-----------|
| A | 6 | 60 | 20 | 20 | 2.1 KÅ |
| B | 6 | 0 | 60 | 20 | 800Å |
| C | 6 | 60 | 20 | 20 | 2.3 KÅ |
| D | 6 | 60 | 20 | 40 | 4.0 KÅ |
| E | 6 | 60 | 20 | 40 | 4.1 KÅ |
| F | 12 | 60 | 20 | 20 | 1.5 KÅ |
| G | 20 | 60 | 20 | 20 | 1.3 KÅ |

The diamond-like carbon films produced in accordance with the process of this invention, and just described, are found to exhibit well defined and consistently reproducible properties and characteristics.

For example, FIG. 4 displays the optical transmission of the films obtained on the KBr substrate, whose intrinsic transparency is also shown in FIG. 4. The films with a thickness of about $\frac{1}{2}$ μm exhibit high transparency at UV wavelength. The films exhibit a transparency of more than 50% for wavelengths above about 200 nm and more than 90% above about 400 nm. The films also exhibit a high index of refraction, about 2 at 850 nm. The refractive index of these films was evaluated on a silicon substrate by observing the first $\frac{1}{4}$ wave reflectivity minimum (anti-reflection thickness found to occur at a wavelength of 850 nanometers).

The index of refraction of the film is given by $Nf = [(No)(Ns)(1-r)/(1+r)]^{\frac{1}{2}}$, where No is the refractive index of air, Ns is the refractive index of the substrate and r is the amplitude reflectivity, at a given optical wavelength. At $\frac{1}{4}$ wave anti-reflection, where $r = >0$, and since No is about 1, the film index at that wavelength is given by $Nf = Ns^{\frac{1}{2}}$. The refractive index of the silicon substrate at 850 nanometers is between 3.6 and 4.3, giving a DLC film index between 1.9 and 2.1. For a $\frac{1}{4}$ wave film thickness, $t = 0.85/2NF = 0.21$ microns, which agreed with that obtained with a profilometer at a mask produced step.

The films survived all attempts at removal from KBr, sapphire and silium substrates by a Scotch brand "adhesive tape" test. Their hardness was estimated as 8–9 on the Moh's scale (about that of sapphire) by comparing the depth of scratches in materials of known hardness. Their chemical inertness to highly reactive chemicals was demonstrated by long exposure to various organic solvents, concentrated HNO$_3$, hot KOH solution and HF solution (BOE). An Auger analysis showed that the film composition is predominantly carbon. The dielectric strength of these films was evaluated at applied fields between 0.25 and 2.5 MV/cm. Below the smaller field these films exhibited an asymptotic resistivity of about $5 \times 10^{11}$ ohm-cm, which decreases to about $7 \times 10^{10}$ ohm-cm at the higher field and exhibited no evidence of electrical breakdown.

What is claimed is:

1. In a plasma assisted chemical vapor transport process for the deposition of a diamond-like carbon film on a substrate in a plasma reaction chamber the improvement comprising employing hydrogen gas as the process gas and introducing said hydrogen gas into a plasma reaction chamber through a porous graphite electrode.

2. The process of claim 1 wherein the plasma reaction chamber has a defined plasma geometry such that the power density in the plasma varies nearly linearly with power supplied and the plasma reactor chamber maintains an essentially uniform gas pressure in the reactor.

3. The process of claim 2 wherein the power density in the plasma is more than 5 watts/cm$^3$ and the gas pressure is about 2 Torr.

4. The process of claim 2 wherein the hydrogen gas is introduced through a process graphite electrode having a gas flow impedance on the order of about $10^{-2}$ sec/cc.

5. A plasma assisted chemical vapor transport process for the production of a diamond-like carbon film comprising:
 (a) introducing into a plasma reactor of fixed plasma geometry, a hydrogen feedgas through a porous graphite electrode,
 (b) forming a volatile hydrocarbon reaction product by reaction of the hydrogen with carbon at the electrode surface,
 (c) transporting the volatile hydrocarbon reaction product to a substrate mounted on a second electrode
 (d) depositing a diamond-like carbon film on said substrate from said volatile hydrocarbon product in a reverse heterogeneous chemical reaction.

6. The process of claim 5 wherein the plasma reaction chamber has a defined plasma geometry such that the power density in the plasma varies nearly linearly with power supplied and the plasma reactor chamber maintains an essentially uniform gas pressure in the reactor.

7. The process of claim 5 wherein the power density in the plasma is more than 5 watts/cm$^3$ and the gas pressure is about 2 Torr.

8. The process of claim 5 wherein the hydrogen gas is introduced through a process graphite electrode having a gas flow impedance on the order of about $10^{-2}$ sec/cc.

9. A diamond-like carbon film produced according to the process of claim 5.

10. The diamond-like carbon film of claim 9 having the following characteristics:
 (a) a transparency of more than 50% for wavelengths above about 200 nm and more than 90% above about 400 nm for films of a thickness of about $\frac{1}{2}$ $\mu$m,
 (b) an index of refraction of about 2 at 850 nm,
 (c) a hardness of about sapphire,
 (d) chemical inertness to concentrated HNO$_3$, hot KOH solution and HF solution, and
 (e) a resistivity of about $10^{11}$ ohm-cm at MV/cm.

* * * * *